United States Patent
Granger-Jones

(10) Patent No.: US 9,214,922 B2
(45) Date of Patent: Dec. 15, 2015

(54) SPAC SERIES PROGRAMMABLE ARRAY OF CAPACITORS

(71) Applicant: RF Micro Devices, Inc., Greensboro, NC (US)

(72) Inventor: Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 189 days.

(21) Appl. No.: 13/935,842

(22) Filed: Jul. 5, 2013

(65) Prior Publication Data

US 2014/0009248 A1  Jan. 9, 2014

Related U.S. Application Data

(60) Provisional application No. 61/668,148, filed on Jul. 5, 2012.

(51) Int. Cl.

| | |
|---|---|
| *H01G 7/00* | (2006.01) |
| *H03H 7/01* | (2006.01) |
| *H03J 5/24* | (2006.01) |
| *H01G 4/38* | (2006.01) |
| *H01G 4/40* | (2006.01) |

(52) U.S. Cl.
CPC ... *H03J 5/246* (2013.01); *H01G 4/38* (2013.01); *H01G 4/40* (2013.01); *H01G 7/00* (2013.01); *H03J 2200/10* (2013.01)

(58) Field of Classification Search
CPC ........... H01G 4/255; H01G 4/38; H03J 5/246; H03J 2200/10
USPC ............................................. 333/174; 361/271
See application file for complete search history.

(56) References Cited

U.S. PATENT DOCUMENTS

| | | | |
|---|---|---|---|
| 6,181,218 B1 | 1/2001 | Clark et al. | |
| 2007/0268725 A1* | 11/2007 | Hatanaka | .............. 363/17 |
| 2011/0260780 A1 | 10/2011 | Granger-Jones et al. | |

* cited by examiner

*Primary Examiner* — Stephen E Jones
*Assistant Examiner* — Erfan Faneian
(74) *Attorney, Agent, or Firm* — Withrow & Terranova, P.L.L.C.

(57) ABSTRACT

A tunable series resonant circuit includes a voltage source, a source impedance, a variable capacitor, a series inductor, and a load impedance. The variable capacitor includes a sPAC (series programmable array of capacitors) having desirable characteristics for a tunable series resonant circuit. The sPAC may be a binary weighted sPAC, a thermometer coded sPAC, or some other sPAC.

24 Claims, 10 Drawing Sheets

BLOCK DIAGRAM OF THE sPAC SERIES
PROGRAMMABLE CAPACITOR ARRAY
(BINARY WEIGHTED)

3 BIT sPAC USING SINGLE SUPPLY
STACKED FET SWITCH ARCHITECTURE

BLOCK DIAGRAM OF THE sPAC SERIES
PROGRAMMABLE CAPACITOR ARRAY
(BINARY WEIGHTED)

BLOCK DIAGRAM OF THE sPAC SERIES
PROGRAMMABLE CAPACITOR ARRAY
(THERMOMETER CODED)

$$V_{pac} = \left(\frac{2 \cdot V_{in} \cdot \sin(\omega t)}{Z_{source} + Z_{load}}\right) \times \left(\frac{-i}{\omega \cdot C_{pac}}\right)$$

EQUATION 1

SERIES RESONANT NETWORK

| | Vgate | Vbody | Vds_BIAS |
|---|---|---|---|
| ON STATE | +Vdd | Gnd | Gnd |
| OFF STATE | -Vdd | -Vdd | Gnd |
| TRANSITION | Gnd | -Vdd | Gnd |
| STATES | Gnd | Gnd | Gnd |

4-stk DC COUPLED +Ve/-Ve
SUPPLY STACKED SWITCH

3 BIT sPAC USING SINGLE SUPPLY STACKED FET SWITCH ARCHITECTURE

FLOATING AC COUPLED SINGLE SUPPLY
STACKED SWITCH

EXAMPLE 3 BIT DESIGNS
WITH BYPASS

| CODE | pPAC | | | | sPAC | | | |
|---|---|---|---|---|---|---|---|---|
| | Cpac | Rseries | Norm. Q  1/(Ron.ωo.Co) | Signal Handling | Cpac | Rseries | Norm. Q  1/(Ron.ωo.Co) | Signal Handling |
| 000 | 0 | NA | NA | 3Vmax | 0.14 Co | 0 | V High | 3.5 Vmax |
| 001 | 0.125 x Co | 12 x Ron | 0.66 | 3Vmax | 0.17 Co | 0.5 Ron | 11.7 | 3 Vmax |
| 010 | 0.25 x Co | 6 x Ron | 0.66 | 3Vmax | 0.2 Co | Ron | 5 | 2.5 Vmax |
| 011 | 0.375 x Co | 4 x Ron | 0.66 | 3Vmax | 0.25 Co | 1.5 Ron | 2.7 | 2.50Vmax |
| 100 | 0.5 x Co | 3 x Ron | 0.66 | 3Vmax | 0.33 Co | 2 Ron | 1.5 | 1.5 Vmax |
| 101 | 0.625 x Co | 2.4 x Ron | 0.66 | 3Vmax | 0.5 Co | 2.5 Ron | 0.8 | 1.0 Vmax |
| 110 | 0.75 x Co | 2 x Ron | 0.66 | 3Vmax | Co | 3 Ron | 0.33 | 0.5 Vmax |
| 111 | 0.875 x Co | 1.7 x Ron | 0.66 | 3Vmax | BYPASS | 3.5 Ron | NA | |
| BYPASS | | 3 x Ron | | | | 3.5 Ron | | |

*FIG. 8*

HAND CALCULATED CAPACITOR VALUES,
Q & SIGNAL HANDLING ASSUMING
RESISTIVE SWITCH WITH FINITE
SIGNAL HANDLING IN THE OFF-STATE hPAC COMPRISING A 3BIT sPAC AND SINGLE BIT pPAC

AN hPAC COMPRISING A THERMOMETER CODED 3-BIT sPAC, AND 3 SINGLE BIT pPACs

SPAC SERIES PROGRAMMABLE ARRAY OF CAPACITORS

RELATED APPLICATIONS

This application claims the benefit of provisional patent application Ser. No. 61/668,148, filed Jul. 5, 2012, the disclosure of which is hereby incorporated herein by reference in its entirety.

FIELD OF THE DISCLOSURE

The field of the disclosure is tunable resonant circuits utilizing a programmable array of capacitors (PAC). Specifically, a series programmable array of capacitors (sPAC) is used as a tuning element in a series resonant circuit, or is placed in series with an RF signal path.

BACKGROUND

Conventionally, variable capacitance may be provided through a parallel programmable array of capacitors (parallel PAC, or pPAC). Using switches (or stacked switches), one or more capacitors may be joined in parallel (or may be isolated) to provide an overall desired variable capacitance.

However, parallel programmable arrays of capacitors have many undesired properties. For example, parallel programmable arrays of capacitors (pPACs) do not have linearity and signal handling capability that is inversely proportional to the PAC capacitance value.

One problem is that conventional pPAC architecture may be over-designed with respect to its linearity for some capacitor tuning values when used in series resonant applications.

It is desired to develop programmable arrays of capacitors that have linearity and signal handling capabilities that are inversely proportional to the PAC capacitance value.

SUMMARY

In one embodiment, a series programmable array of capacitors (sPAC) is used as a tuning element in a series resonant circuit, or is placed in series with the RF signal path. The signal handling and Q characteristics of the sPAC are better suited for tuning series resonant circuits than the conventional parallel programmable array of capacitors (pPAC).

In another embodiment, a hybrid programmable array of capacitors (hybrid PAC, or hPAC) combines elements of the pPAC and the sPAC. In certain applications the hPAC's distortion and Q characteristics may be more desirable than either the pPAC or sPAC. There are a large number of potential hPAC variants made of different combinations & permutations of the sPAC & pPAC elements.

Specifically, the use of sPACs or hPACs may significantly reduce the size of (and/or improve the linearity of) SOI based antenna tuning PACs (programmable arrays of capacitors), especially in applications where a PAC is placed in series with the signal path.

The new sPAC (and hPAC) architecture's linearity changes as a function of capacitor tuning (high linearity for low capacitance value), and this feature allows a smaller overall switch area. The existing parallel pPAC architecture is over designed with respect to its linearity for some capacitor tuning values when used in series resonant applications.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 8 illustrates calculated capacitor values, series resistance, Q, and signal handling for pPAC and for sPAC.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
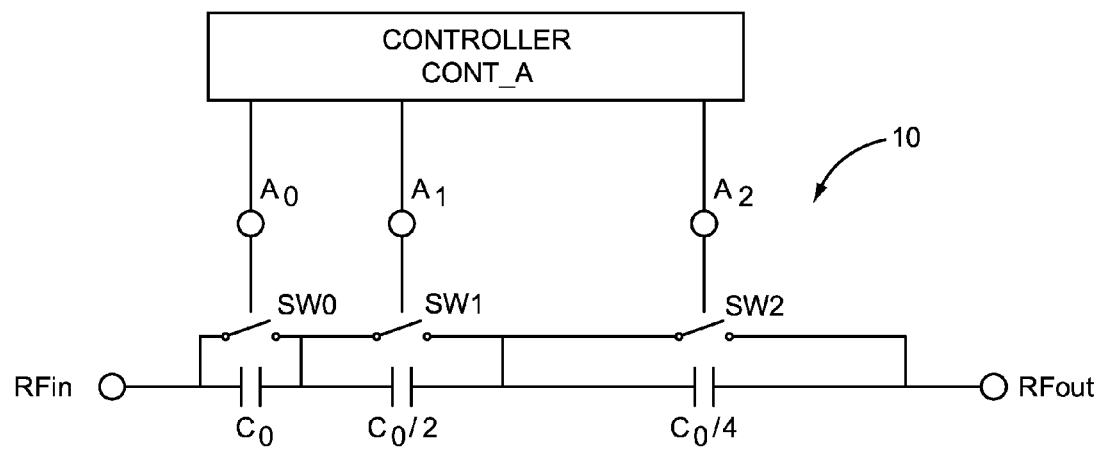
FIG. 1 illustrates a series programmable array of capacitors (sPAC) that is binary weighted.

FIG. 1 illustrates a series programmable array of capacitors (sPAC) 10 that is binary weighted. Three capacitors are in series, the first having a capacitance of Co, the second having a capacitance of Co/2 (for example), and the third having a capacitance of Co/4 for (example). The capacitors may be in a different order. Each capacitor is in parallel with a switch, labeled SW0, SW1, and SW2 respectively. Each switch is controlled by a control line, labeled A0, A1, and A2 respectively. The control lines are controlled by a controller CONT_A.

The capacitance of a series of capacitors (C1, C2, and C3) is calculated by 1/Cseries=1/C1+1/C2+1/C3. The capacitance of FIG. 1 sPAC (with all switches open) is 1/Cseries=1/Co+1/(Co/2)+1/(Co/4). Other values may be obtained by closing one or more switches. If all switches are closed, then the sPAC acts as a bypass (with no capacitance).

The sPAC's signal handling and Q properties vary as a function of the tuning word (as a function of the signals on the control lines). The quality (Q) and signal handling characteristics of an sPAC are different than those of a pPAC, and are preferable for certain applications (especially when the signal handling requirements are a function of the PAC tuning).

The sPAC structure is particularly useful for tuning applications that require a bypass switch in parallel with the PAC. The sPAC structure naturally (or inherently) incorporates a bypass feature, thus no additional bypass switches are necessary. This inherent bypass feature reduces both area and parasitic loading (in comparison to pPACs). The sPAC can be implemented as a binary weighted (FIG. 1) or as a thermometer coded architecture (as shown below in FIG. 2). PACs are sometime referred to as DTCs (Digitally Tunable Capacitors).

Figure 2:
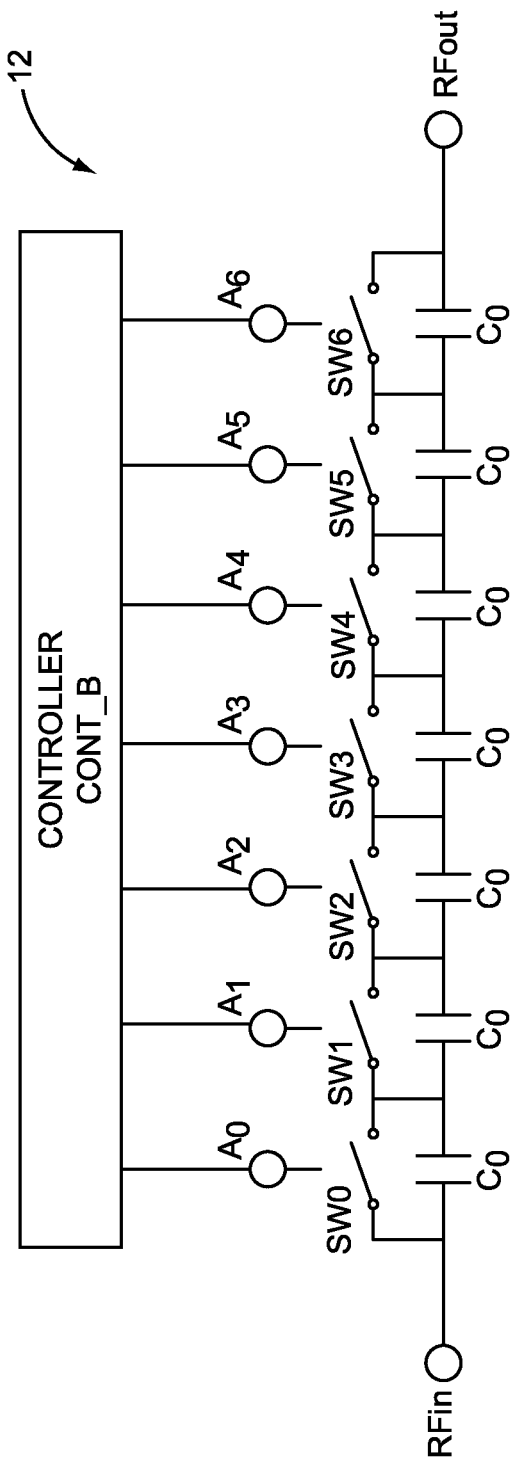
FIG. 2 illustrates a series programmable array of capacitors (sPAC) that is thermometer coded.

FIG. 2 illustrates a series programmable array of capacitors (sPAC) 12 that is thermometer coded. In FIG. 2, a series of 7 capacitors is shown. Each capacitor has an identical capacitance Co, each capacitor is in parallel with a switch (SW0, SW1, SW2, SW3, SW4, SW5, and SW6 respectively), and each switch is controlled by a control line (A0, A1, A2, A3, A4, A5, and A6 respectively). The control lines are controlled by a controller CONT_B.

By comparison, the binary weighted sPAC has capacitors and has lower parasitics than the thermometer sPAC. The thermometer coded sPAC provides for more independent control of the capacitor values and signal handling than the binary weighted sPAC, and has an inherently monotonic control characteristic.

Additionally, the thermometer coded sPAC has the advantage of switching only one switch at a time to change between adjacent LSB states (thus having fewer switching transients than the binary weighted sPAC). In a binary weighted design there are some LSB transitions that require every switch in the design to change states. However, the thermometer coded sPAC has the disadvantage of requiring more circuitry (and more area) than the binary weighted sPAC.

Figure 3:
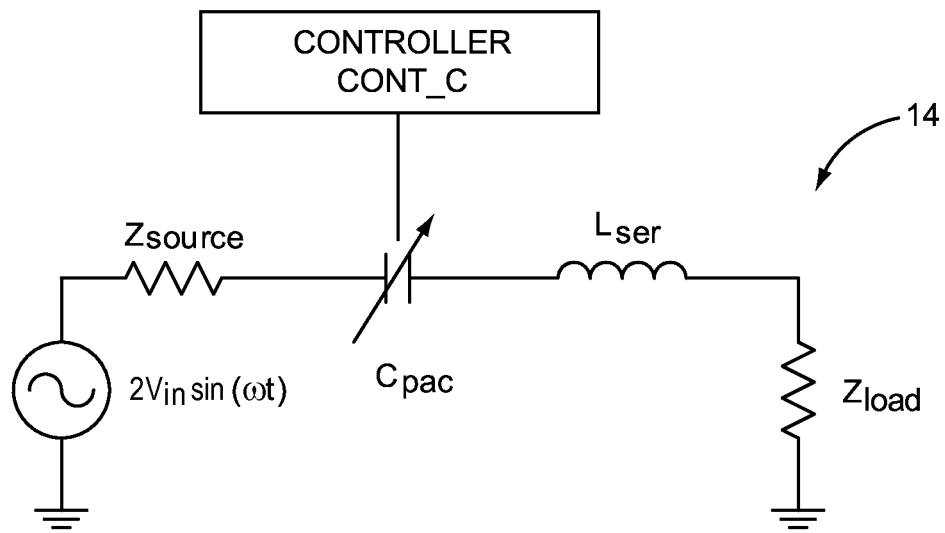
FIG. 3 illustrates a series resonant circuit including a programmable array of capacitors (PAC).

FIG. 3 illustrates a series resonant circuit 14 including a programmable array of capacitors (PAC) providing a variable (tunable) capacitance Cpac. The programmable array of capacitors is controlled by a controller CONT_C. The controller CONT_C may also monitor all of the voltages and currents in the series resonant circuit 14, and use the monitored information to control the programmable array of capacitors Cpac.

The series resonant circuit 14 includes: a voltage source $2V_{in}SIN(\Omega t)$, a source impedance Zsource, a variable capacitor Cpac, a series inductor Lser, and finally a load impedance Zload. The voltage Vpac across the variable capacitor Cpac is calculated by equation 1 as shown in FIG. 3, and is largest when Cpac is smallest.

The voltage across a capacitor in a series resonant circuit, at resonance, is inversely proportional to the capacitor value. Thus, the voltage Vpac is inversely proportional to the capacitor value Cpac. It is desirable to have a PAC with linearity and signal handling characteristics that are inversely proportional to the capacitor value Cpac.

In general, the linearity and signal handling characteristics of a PAC used to tune the resonant circuit is a function of the RF (Radio Frequency) voltage swing across the PAC. Beginning in the OFF state, PAC elements tend to cause a sudden degradation in linearity if they start to turn ON for part of an RF cycle. The mechanisms that cause distortion tend to be voltage driven, and are caused either by the Vgs or Vgd voltage swing being sufficient to turn ON previously OFF state capacitors during part of the RF cycle, or are caused by voltage induced RF leakage across drain-source junctions.

Various types of stacked switches may be used for the switches of a sPAC. Specific examples are provided in later figures. For example, the switches may include high dynamic range stacked FET switch structures.

Figure 4:
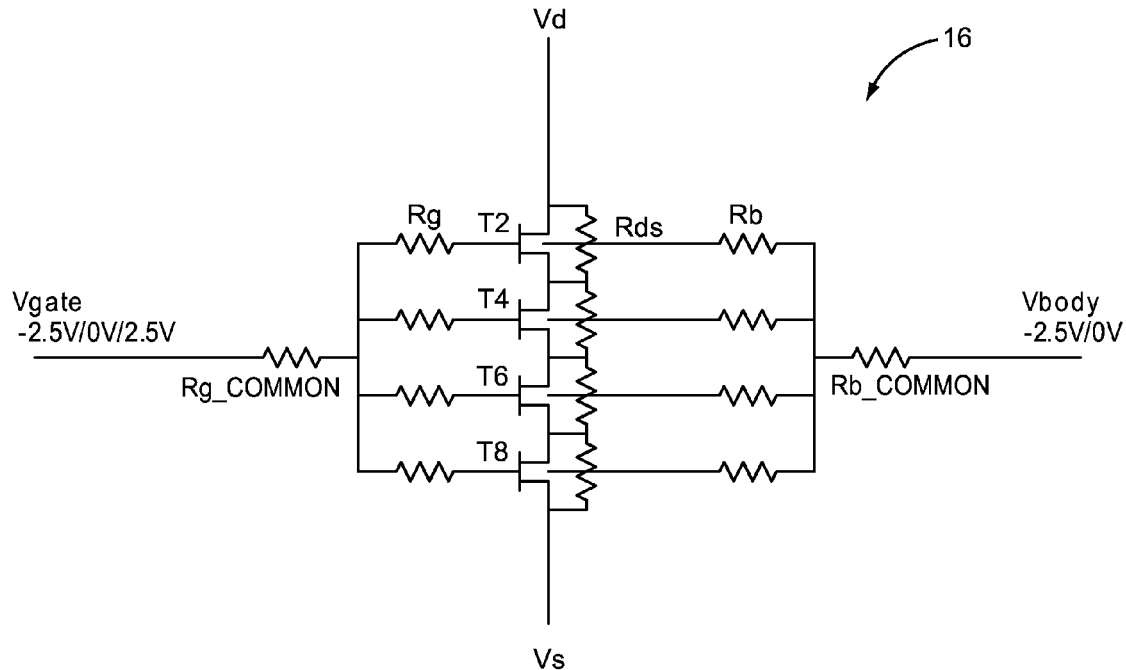
FIG. 4 illustrates an exemplary high dynamic range RF (Radio Frequency) switch comprising four stacked devices.

FIG. 4 illustrates an exemplary high dynamic range RF (Radio Frequency) switch 16 comprising four stacked devices. In this example, the four stacked devices are FET transistors T2, T4, T6, and T8 organized in a DC (Direct Current) coupled stacked FET switch architecture utilizing +Ve and −Ve voltage supplies (e.g., +2.5V and −2.5V). The positive voltage (+Ve) is typically the highest value voltage that the process can reliably work with. The negative voltage (−Ve) is typically chosen to maximize the dynamic range without stressing the devices beyond their reliability limits. For some devices, a negative voltage near −1.5V gives better results.

Various resistors are illustrated: common gate resistor Rg_COMMON, gate resistors Rg, drain-source resistors Rds, base resistors Rb, and common base resistor Rb_COMMON.

A table in FIG. 4 illustrates the gate voltage Vgate, the body voltage Vbody, and the bias voltage Vds_BIAS during the following states: ON state, OFF state; and transition states.

The switch in FIG. 4 may be described as a DC coupled stacked FET switch architecture using +Ve and −Ve supplies. Single supply sPACs may also be used, as described below in FIG. 5.

Figure 5:
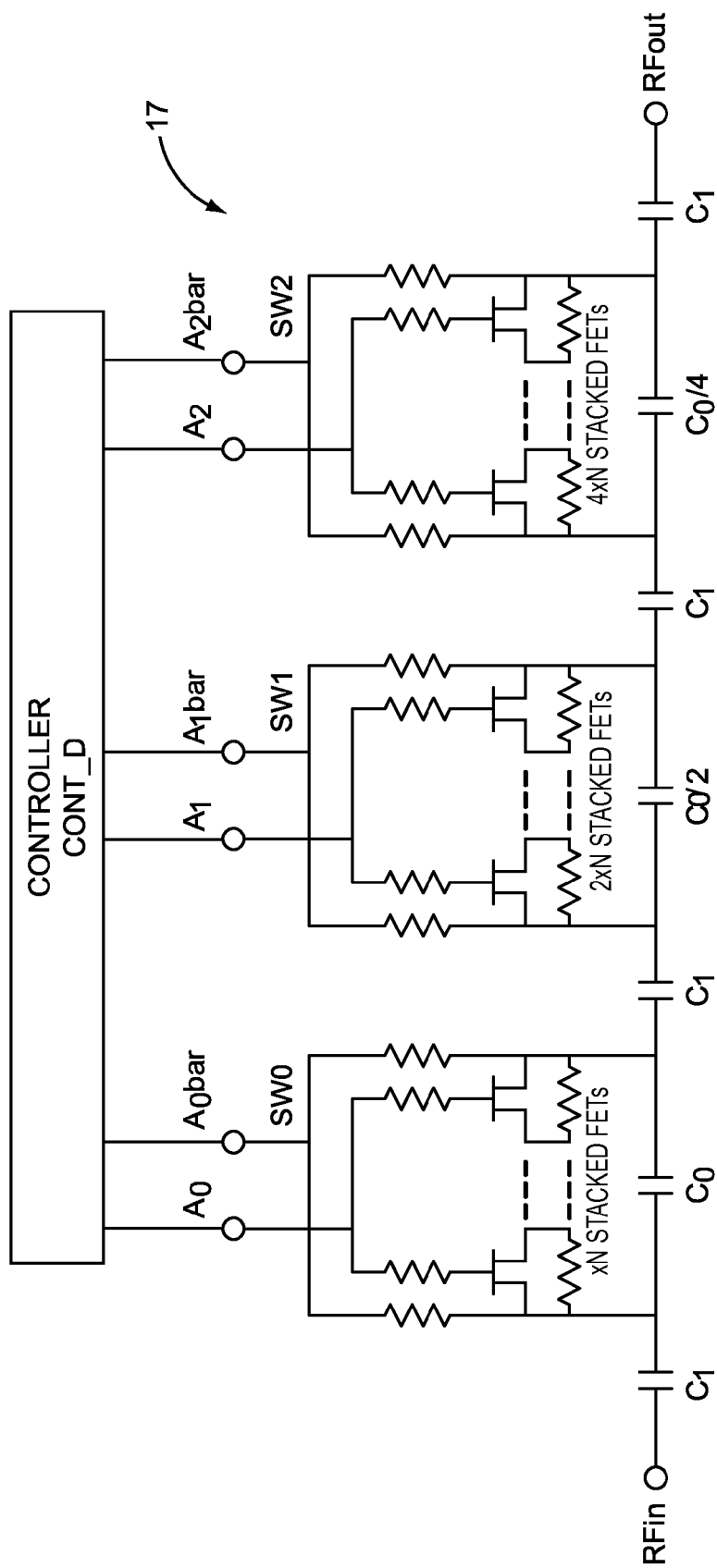
FIG. 5 illustrates a 3 bit sPAC using single supply stacked FET (Field Effect Transistor) switch architecture, and including series coupling capacitors for DC biasing.

FIG. 5 illustrates an alternative embodiment of an sPAC, including a 3 bit binary coded sPAC 17 using single supply stacked FET (Field Effect Transistor) switch architecture, and including series coupling capacitors C1 for DC biasing. This illustrated architecture does not require any negative voltage supply. Further, this illustrated architecture generally fixes the body voltage of the FETs at ground (not shown).

The binary coded sPAC 17 of FIG. 5 is similar to the binary coded sPAC of FIG. 1, but also includes series coupling capacitors C1. In FIG. 5, binary coded capacitors Co, Co/2, and Co/4 are in series. Switches SW0, SW1, and SW2 are respectively in parallel with the binary coded capacitors. One series coupling capacitor C1 is located in series between each binary coded capacitor. Additional series coupling capacitors C1 may be located in series before and after the series of binary coded capacitors. In this architecture the resistive bypass function of FIG. 4 is replaced by a capacitive bypass function.

From left to right, the following structures are in series: an RF input (RFin) node; a first series coupling capacitor C1; a binary coded capacitor Co in parallel with switch SW0; a second series coupling capacitor C1; a binary coded capacitor Co/2 in parallel with switch SW1; a third series coupling capacitor C1; a third binary coded capacitor Co/4 in parallel with switch SW2; a fourth series coupling capacitor C1; and an RF output (RFout) node.

Switch SW0 includes a set of N stacked FETs, controlled by control lines A0 and A0bar. Switch SW1 includes a set of 2×N stacked FETs controlled by control lines A1 and A1bar. Switch SW2 includes a set of 4×N stacked FETs controlled by control lines A2 and A2bar. For example, if N=4, then SW0 has 4 stacked FETs, SW1 has 8 stacked FETs, and SW2 has 12 stacked FETs. In general, a binary coded capacitor Co/M is in parallel with a switch having a set of M×N stacked FETs. The control lines are controlled by a controller CONT_D.

Figure 6:
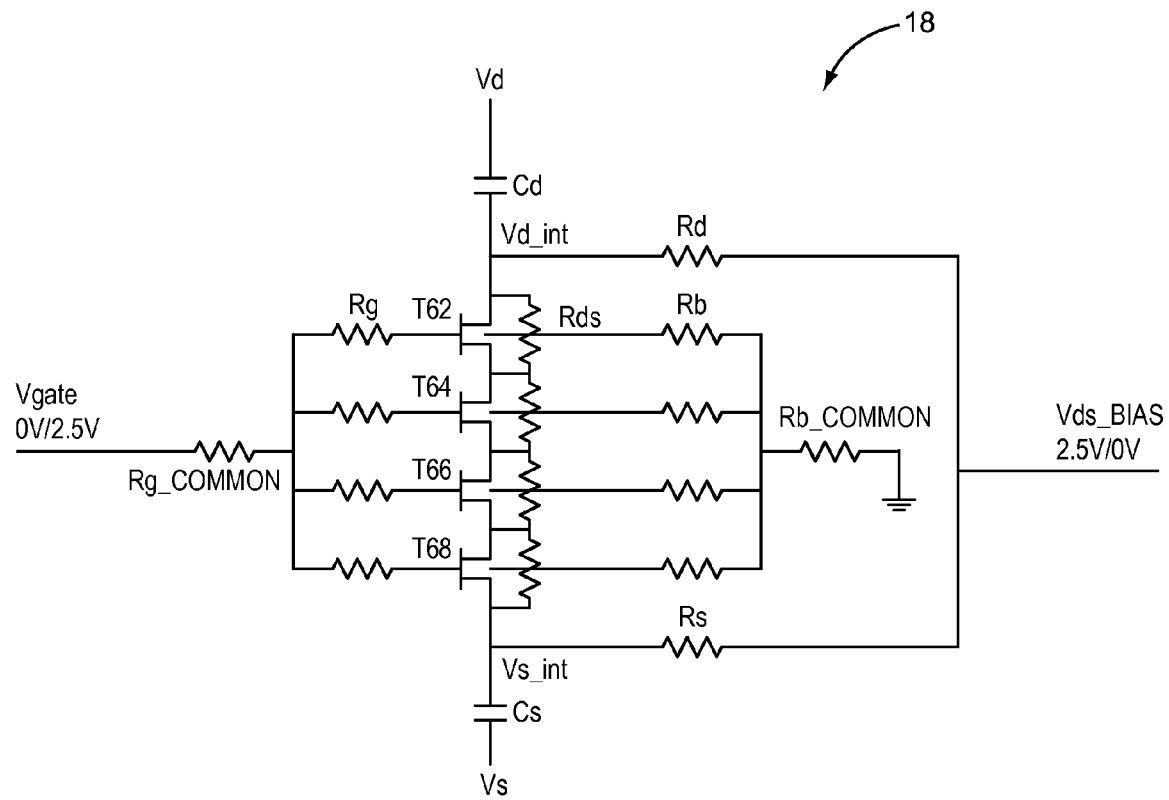
FIG. 6 illustrates a floating AC (alternating current) coupled single supply stacked switch including 4 stacked FETs.

FIG. 6 illustrates an embodiment of switch SW0 of FIG. 5. Specifically, switch SW0 is a floating AC (alternating current) coupled single supply stacked switch 18 including 4 stacked FETs (T62, T64, T66, and T68).

Control line A0 in FIG. 5 corresponds to Vgate in FIG. 6. Control line A0bar corresponds to Vds_BIAS in FIG. 6. A table in FIG. 6 illustrates the control voltages for the ON state, the OFF state, and TRANSITION states. Numerous resistors Rg_COMMON, Rg, Rds, Rb, Rb_COMMON, Rd, and Rs may be located as shown to reduce currents and to reduce transients.

Capacitors Cd and Cs may be located at the drain and the source ends of the stacked FETs, as shown. From top to bottom, voltage Vd is applied to capacitor Cd. Voltage Vd_int (internal drain voltage) exits capacitor Cd and is applied to the stacked FETs. Voltage Vd_int (internal source voltage) exits the stacked FETs and is applied to capacitor Cs. Finally, voltage Vs exits capacitor Cs.

Figure 7:
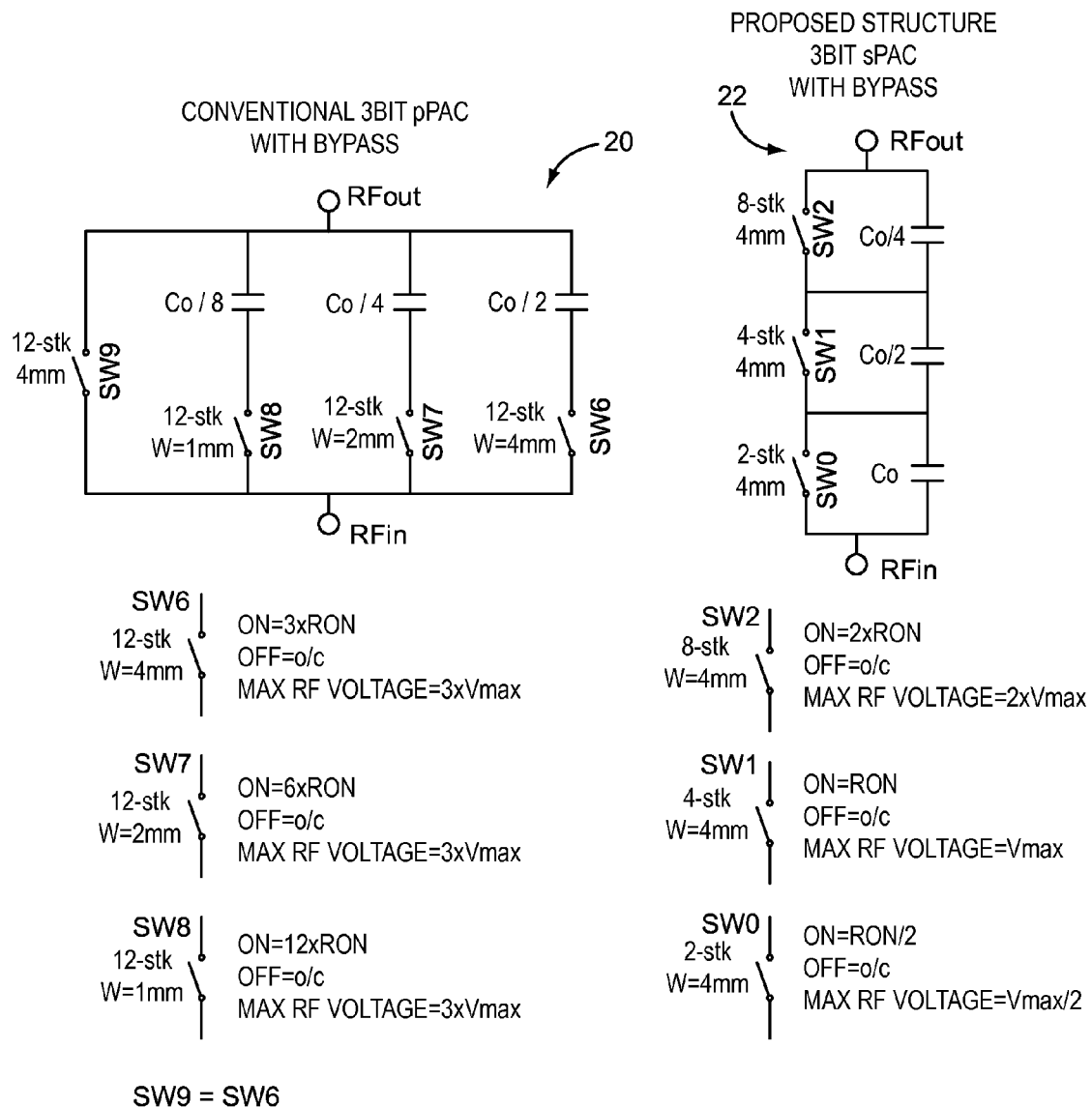
FIG. 7 illustrates a 3 bit pPAC with bypass, and a 3 bit SPAC with bypass.

FIG. 7 illustrates a conventional 3 bit pPAC (parallel Programmable Array of Capacitors) 20 with bypass, and a 3 bit binary coded sPAC 22 with bypass. This pPAC 20 and this sPAC 22 are designed to be roughly comparable (have similar signal handling characterisitics) under some conditions.

The conventional 3 bit pPAC 20 is augmented with a bypass switch SW9 so that the augmented pPAC may perform the bypass function that is inherently available in the sPAC. In this way, circuits with similar functions may be evaluated (comparing apples with apples, or comparing augmented pPAC with sPAC).

The pPAC 20 is a binary weighted pPAC, wherein the parallel capacitors vary in size by a factor of two. Similar results may be obtained with a "thermometer" pPAC, wherein seven equal capacitors may be in parallel (not shown). Thus, binary weighted pPAC 20 may be controlled by a 3 bit code word (or perhaps more accurately by a four bit code word if the augmented bypass feature is considered).

The conventional 3 bit pPAC 20 with bypass (or augmented pPAC) includes the following structures arranged in parallel (from right to left): a capacitor Co/2 in series with a switch SW6 (a 12 stack FET with width of 4 mm); a capacitor Co/4 in series with a switch SW7 (a 12 stack FET with width of 2 mm); a capacitor Co/8 in series with a switch SW8 (a 12 stack FET with width of 1 mm); and finally a bypass switch SW9 (a 12 stack FET with width of 4 mm).

The parameters of each switch (SW6 through SW9) are provided directly below the conventional 3 bit pPAC 20 with bypass. It is important to note that each parallel structure must be capable of handling the entire voltage from RFin to RFout because there is no voltage division in parallel structures. Thus, each switch must be capable of handling the entire voltage, and each switch should have the same number of FETs stacked (in this case, 12 stacked FETs).

The current handling capabilities of these parallel structures in pPAC 20 are roughly proportional to the size of the capacitor, and thus switch SW6 requires a greater FET width than switch SW7 (to handle greater current), and switch SW7 requires a greater FET width than switch SW8 (to handle greater current).

The 3 bit binary coded sPAC 22 (with inherent bypass) includes the following structures in series from bottom to top: an RF input node RFin; a capacitor Co in parallel with switch SW0; a capacitor Co/2 in parallel with switch SW1; a capacitor So/4 in parallel with switch SW2; and an RF output node RFout.

In the sPAC, these structures in series provide voltage division for the RF signal. For example, in the bypass mode all three switches (SW0, SW1, and SW2) are closed. Each closed switch has some resistance (RON/2, RON, and 2×RON respectively), such that no single switch sees the entire RF signal voltage. Thus, the three switches have 2 stacked FETs, 4 stacked FETs, and 8 stacked FETs respectively. The maximum voltage handling for stacked FETs is directly proportional (to a first order approximation) to the number of FETs stacked. (In contrast to the sPAC, the bypass switch SW9 of the 3 bit pPAC requires 12 stacked FETs.)

An sPAC may use the advantage of voltage division to be smaller in area than a comparable pPAC. As shown, the sPAC 22 uses only about 40% of the area of the pPAC 20. Alternatively, the sPAC 22 may be similar in area to a pPAC 20, and may use this similar area to provide improved energy efficiency or improved transient response (relative to a pPAC 20).

Other compromises may be made with the sPAC structure. For example, FET area and quality Q may be traded for more signal handling capability at the mid-range tuning codes. All such variations are considered to be within the scope of the present disclosure.

The sPAC 22 has the disadvantage that (relative to the pPAC), even if all switches are open, there is still capacitance between the RF nodes.

FIG. 8 illustrates a table providing calculated capacitor values, series resistance, Q, and signal handling for a pPAC 20 and for a comparable sPAC 22.

The leftmost column provides a 3 bit control signal code (or word). Code 000 indicates that all three binary coded switches are open. As previously discussed, if a pPAC is augmented with a bypass switch (see pPAC 20 in FIG. 7), then (strictly speaking) an additional control line is required. For pPAC 20 with bypass, the bypass code would be 1000, indicating that that the bypass switch is closed, and the other three switches are open.

For pPAC 20, code 001 indicates that only switch SW8 is closed (in series with the smallest capacitor). Code 010 indicates that only switch SW7 is closed. Code 100 indicates that only switch SW6 is closed.

In a 3 bit binary coded sPAC (such as sPAC 22 in FIG. 7), code 111 indicates that all three switches (SW0, SW1, and SW2) are closed, and the sPAC is in a bypass mode (or bypass status, or bypass condition).

In the pPAC, quality Q is constant at 0.66 (except at code 000 wherein all switches are open, including the bypass switch), and signal handling capability is constant at 3V maximum. Thus, for a pPAC, quality Q and signal handling are independent of tuning (except at code 000 for the case of zero capacitance when the entire array is open circuited). These pPAC characteristics are useful for tuning parallel resonant circuits (not shown).

In contrast to pPACs, for a sPAC (such as binary coded sPAC 22 in FIG. 7) the quality Q varies in inverse proportion to the capacitance. Additionally, the signal handling capability varies in inverse proportion to the capacitance. These sPAC characteristics are useful for tuning series resonant circuits (e.g. FIG. 3), and for other circuits as well. For example, a sPAC may be used for antenna tuning, or for a tunable filter.

Figure 9:
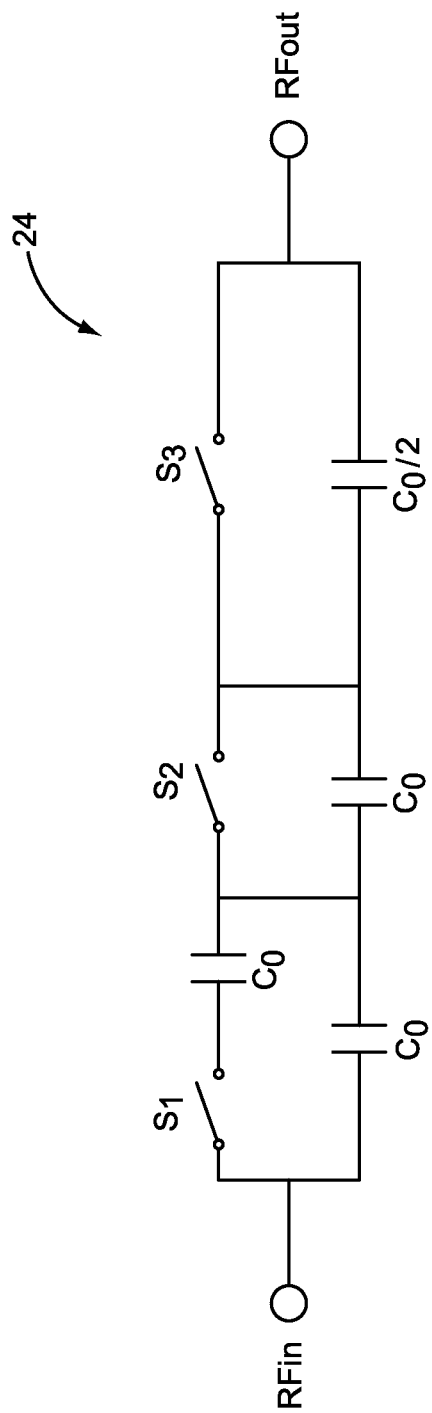
FIG. 9 illustrates a hybrid PAC (hPAC) including a 3 bit sPAC and a single bit pPAC.

FIG. 9 illustrates a hybrid PAC (hPAC) 24 including a 3 bit sPAC and a single bit pPAC.

A hybrid PAC is a combination of series and parallel PACs. There are a large number of possible hPAC designs though permutations and combinations of different numbers of pPACs and sPACs, with or without bypasses. Each hPAC will have a different Q and signal handling characteristic that may be optimum for a particular tuning requirement.

In FIG. 9, a 3 bit sPAC comprises, from left to right: a first series structure (Co in parallel with S1); a second series structure (Co in parallel with S2); and a third series structure (Co/2 in parallel with S3). This 3 bit sPAC is not a binary weighted sPAC, and is not a thermometer sPAC.

Additionally, the first series structure includes an additional capacitor Co in series with switch S1, and functions as a single bit pPAC.

Figure 10:
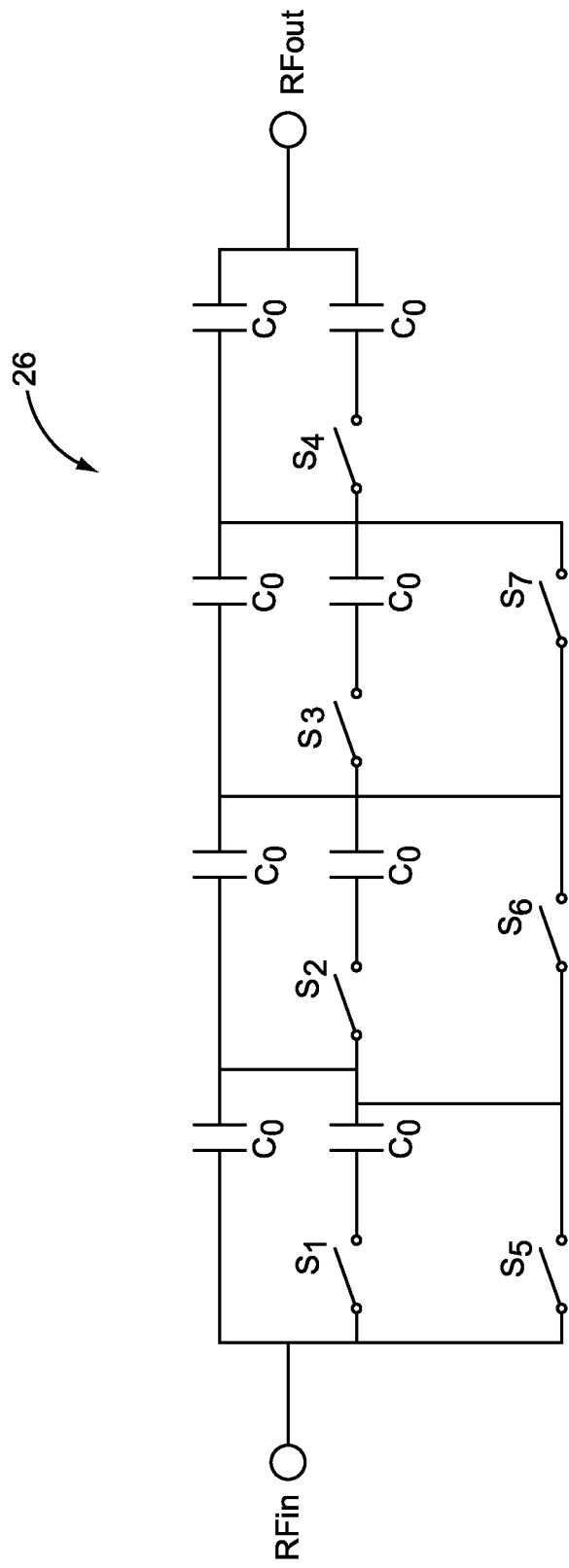
FIG. 10 illustrates a hybrid PAC (hPAC) including a thermometer coded three bit sPAC and three single bit pPACs.

FIG. 10 illustrates a hybrid PAC (hPAC) including a thermometer coded three bit sPAC and three single bit pPACs.

In FIG. 10, a complex hybrid PAC 26 may be described as including a thermometer coded three bit sPAC. The three bit sPAC is identifiable by three switches S5, S6, and S7 in series, each switch being in parallel with a capacitor Co. Additionally, three single bit pPACs are identifiable by switches S1, S2, and S3. This hybrid is complex, and is difficult to describe using sPAC and pPAC terminology.

There are a large number of possible hPAC designs though permutations and combinations of different numbers of pPACs and sPACs with or without bypasses. Each hPAC will have a different Q and signal handling characteristic that may be optimum for a particular tuning requirement.

Those skilled in the art will recognize improvements and modifications to the preferred embodiments of the present disclosure. All such improvements and modifications are considered within the scope of the concepts disclosed herein and the claims that follow.

What is claimed is:

1. A sPAC (series programmable array of capacitors) circuit comprising:
    a first capacitor;
    a second capacitor in series with the first capacitor, wherein the second capacitor has approximately half of a capacitance of the first capacitor;
    a first switch in parallel with the first capacitor; and
    a second switch in parallel with the second capacitor, wherein the sPAC is a binary weighted sPAC.

2. The sPAC circuit of claim 1, further comprising:
    a first control node configured to control the first switch; and
    a second control node configured to control the second switch.

3. The sPAC circuit of claim 1, wherein the sPAC is configured to accept positive and negative control voltages.

4. The sPAC circuit of claim 3, wherein the first switch is a DC (direct current) coupled stacked switch including at least two FETs (Field Effect Transistors).

5. The sPAC circuit of claim 1, wherein the sPAC is not configured to accept negative control voltages.

6. The sPAC circuit of claim 5, wherein the first switch is a single supply stacked FET (Field Effect Transistor).

7. The sPAC circuit of claim 6, wherein the second switch has twice as many stacked FETs as the first switch has.

8. The sPAC circuit of claim 7, further comprising a first coupling capacitor located in series between the first capacitor and the second capacitor.

9. The sPAC circuit of claim 8, further comprising:
    a third capacitor located in series with the second capacitor;
    a third switch located in parallel with the third capacitor; and
    a second coupling capacitor located in series between the second capacitor and the third capacitor.

10. The sPAC circuit of claim 9, wherein the third capacitor has a capacitance of approximately one fourth of the first capacitor, and wherein the third switch has approximately four times as many stacked FETs as the first switch.

11. A sPAC (series programmable array of capacitors) circuit comprising:
    a first capacitor;
    a second capacitor in series with the first capacitor, wherein the second capacitor is approximately equal in capacitance to the first capacitor;
    a first switch in parallel with the first capacitor; and
    a second switch in parallel with the second capacitor, wherein the sPAC is a thermometer coded sPAC.

12. A sPAC (series programmable array of capacitors) circuit comprising:
    a first capacitor;
    a second capacitor in series with the first capacitor;
    a first switch in parallel with the first capacitor;
    a second switch in parallel with the second capacitor;
    a source impedance in series with the sPAC; and
    a series inductor in series with the sPAC.

13. The sPAC circuit of claim 12, further comprising:
    a control portion configured to control the sPAC such that the sPAC circuit is matched to an external load.

14. The sPAC circuit of claim 12, wherein the sPAC is a binary weighted sPAC, and wherein the second capacitor has approximately half of the capacitance of the first capacitor.

15. The sPAC circuit of claim 12, wherein the sPAC is a thermometer coded sPAC, and wherein the second capacitor is approximately equal in capacitance to the first capacitor.

16. The sPAC circuit of claim 12, wherein the sPAC is configured to accept positive and negative control voltages.

17. The sPAC circuit of claim 16, wherein the first switch is a DC (direct current) coupled stacked switch including at least two FETs (Field Effect Transistors).

18. The sPAC circuit of claim 12, wherein the sPAC is not configured to accept negative control voltages.

19. The sPAC circuit of claim 18, wherein the first switch is a single supply stacked FET (Field Effect Transistor).

20. The sPAC circuit of claim 19, wherein:
    the sPAc is binary coded;
    the second capacitor has about one half of the capacitance of the first capacitor.

21. The sPAC circuit of claim 20, wherein the second switch has twice as many stacked FETs as the first switch has.

22. The sPAC circuit of claim 21, further comprising a first coupling capacitor located in series between the first capacitor and the second capacitor.

23. The sPAC circuit of claim 22, further comprising:
    a third capacitor located in series with the second capacitor;
    a third switch located in parallel with the third capacitor; and
    a second coupling capacitor located in series between the second capacitor and the third capacitor.

24. The sPAC circuit of claim 23, wherein the third capacitor has a capacitance of approximately one fourth of the first capacitor, and wherein the third switch has approximately four times as many stacked FETs as the first switch.

* * * * *

UNITED STATES PATENT AND TRADEMARK OFFICE
CERTIFICATE OF CORRECTION

PATENT NO. : 9,214,922 B2  Page 1 of 1
APPLICATION NO. : 13/935842
DATED : December 15, 2015
INVENTOR(S) : Marcus Granger-Jones It is certified that error appears in the above-identified patent and that said Letters Patent is hereby corrected as shown below:

In the Specification:

In column 5, line 8, replace "Vd_int" with --Vs_int--.

Signed and Sealed this
Fifth Day of April, 2016

Michelle K. Lee
*Director of the United States Patent and Trademark Office*